United States Patent
Chen et al.

(10) Patent No.: US 8,546,904 B2
(45) Date of Patent: Oct. 1, 2013

(54) INTEGRATED CIRCUIT WITH TEMPERATURE INCREASING ELEMENT AND ELECTRONIC SYSTEM HAVING THE SAME

(75) Inventors: Hsieh-Chun Chen, Taichung (TW); Tsang-Yi Chen, New Taipei (TW)

(73) Assignee: Transcend Information, Inc., NeiHu Dist, Taipei (TW)

( * ) Notice: Subject to any disclaimer, the term of this patent is extended or adjusted under 35 U.S.C. 154(b) by 56 days.

(21) Appl. No.: 13/180,505

(22) Filed: Jul. 11, 2011

(65) Prior Publication Data
US 2013/0015548 A1   Jan. 17, 2013

(51) Int. Cl.
*H01L 31/058* (2006.01)

(52) U.S. Cl.
USPC ............. 257/467; 257/48; 438/14; 438/15; 438/16; 438/17; 438/18

(58) Field of Classification Search
USPC ........................................................ 257/467
See application file for complete search history.

(56) References Cited

U.S. PATENT DOCUMENTS

| | | | | |
|---|---|---|---|---|
| 5,173,762 A * | 12/1992 | Ota | | 257/666 |
| 5,770,973 A * | 6/1998 | Fujisawa et al. | | 330/289 |
| 5,920,119 A * | 7/1999 | Tamba et al. | | 257/718 |
| 6,002,173 A * | 12/1999 | Casati et al. | | 257/739 |
| 6,320,747 B1 * | 11/2001 | Jahn et al. | | 361/704 |
| 6,623,992 B1 * | 9/2003 | Haehn et al. | | 438/11 |
| 6,953,987 B2 * | 10/2005 | Numazaki et al. | | 257/666 |
| 2005/0029244 A1 * | 2/2005 | Ito et al. | | 219/444.1 |
| 2005/0104611 A1 * | 5/2005 | Hong et al. | | 324/760 |
| 2005/0258165 A1 * | 11/2005 | Takei et al. | | 219/482 |
| 2006/0019415 A1 * | 1/2006 | Jaiswal et al. | | 438/14 |
| 2006/0272403 A1 * | 12/2006 | Watanabe et al. | | 73/204.26 |
| 2006/0290366 A1 * | 12/2006 | Kon et al. | | 324/760 |
| 2008/0046110 A1 * | 2/2008 | Sugishita et al. | | 700/207 |
| 2008/0116925 A1 * | 5/2008 | Sunohara et al. | | 324/761 |
| 2008/0164899 A1 * | 7/2008 | Ando et al. | | 324/760 |
| 2009/0002010 A1 * | 1/2009 | Wong et al. | | 324/760 |
| 2009/0022203 A1 * | 1/2009 | Arsovski et al. | | 374/132 |
| 2010/0066398 A1 * | 3/2010 | Ando et al. | | 324/760 |
| 2011/0044009 A1 * | 2/2011 | Fukuda et al. | | 361/720 |
| 2011/0159815 A1 * | 6/2011 | Wu et al. | | 455/41.2 |
| 2011/0216482 A1 * | 9/2011 | Moscovitch et al. | | 361/679.01 |
| 2012/0039042 A1 * | 2/2012 | Moscovitch et al. | | 361/701 |

* cited by examiner

*Primary Examiner* — N Drew Richards
*Assistant Examiner* — Ankush Singal
(74) *Attorney, Agent, or Firm* — Winston Hsu; Scott Margo

(57) ABSTRACT

To provide an integrated circuit with functionality under environment with temperature lower than a working condition, the integrated circuit is designed to include a heating element incorporated with signal pins on a carrier, such as a lead frame, that supports a chip die and controlled by a heating control unit to increase temperature of the chip die. The heating control unit provides voltage for the heating element when a detecting unit detects that the temperature of the chip die falls below a predetermined temperature and a power control unit provide operation power for the chip die when the temperature of the chip die detected by the detecting unit reaches or falls above the predetermined temperature.

3 Claims, 8 Drawing Sheets

INTEGRATED CIRCUIT WITH TEMPERATURE INCREASING ELEMENT AND ELECTRONIC SYSTEM HAVING THE SAME

BACKGROUND

1. Technical Field

The invention relates to an integrated circuit and an electronic system having the same, and more particularly, to an integrated circuit that can be heated to an operational condition and an electronic system having the same.

2. Description of the Conventional Art

Electrical components for commercial purpose generally come with specification of working temperature between 0~70° C., while those for industrial standard must satisfy the requirement for working between −40° C.~85° C., which have greater workable range in temperature than commercially designed components. Although most commercially designed flash memories are workable at the temperature up to 85° C. just as industrially designed ones do, no such memories are functional at the temperature under −20° C. It is because flash memories are not like CPUs or DRAMs, which become even suitable for operating at higher frequency under lower temperature.

There may be some ways to find out if products can be used under the industrial environment condition. In one way, all components of a product must be chosen to meet the industrial requirement, or in another way, these products are to be tested by a standard procedure, sorting, to see if these products satisfy the industrial requirement.

Sorting is, however, an additional cost, while going through sorting procedure under low temperature, lower than −20° C. for example, must also take some other issues into account, such as vapor condensation, chamber configuration, etc. Hence, it is a critical need for allowing electrical components like the flash memories to function normally under the environment with the temperature lower than its operating condition.

SUMMARY

An electronic system is disclosed. The electronic system includes an integrated circuit, a power control unit, a heating control unit, and a detecting unit. The integrated circuit includes a chip die, a carrier for supporting the chip die, and a molding compound for packaging the chip die and the carrier. The carrier includes a heating element for increasing temperature of the chip die, and a plurality of signal pins for connecting to the chip die. The power control unit electrically connects to the integrated circuit for providing an operation power for the integrated circuit. The heating control unit electrically connects to the heating element. The detecting unit is utilized for detecting temperature of the chip die.

An integrated circuit is also disclosed. The integrated circuit includes a chip die, a carrier, and a molding compound. The carrier is disposed to carry and combine with the chip die, and includes a heating element for increasing temperature of the chip die, and a plurality of signal pins for connecting to the chip die. The molding compound packages the chip die and the carrier.

A method for increasing temperature of an integrated circuit is also disclosed. The integrated circuit includes a chip die, a carrier for supporting the chip die, and a molding compound for packaging the chip die and the carrier. The carrier includes a heating element for increasing temperature of the chip die and a plurality of signal pins for connecting to the chip die. The method includes following steps: detecting temperature of the chip die of the integrated circuit by using a detecting unit; heating the chip die by using the heating element in the integrated circuit when temperature of the chip die is lower than a predetermined temperature, wherein the heating element is controlled by a heating control unit; and providing an operation power to the chip die when temperature of the chip die reaches or falls above the predetermined temperature, wherein the operation power is provided by a power control unit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
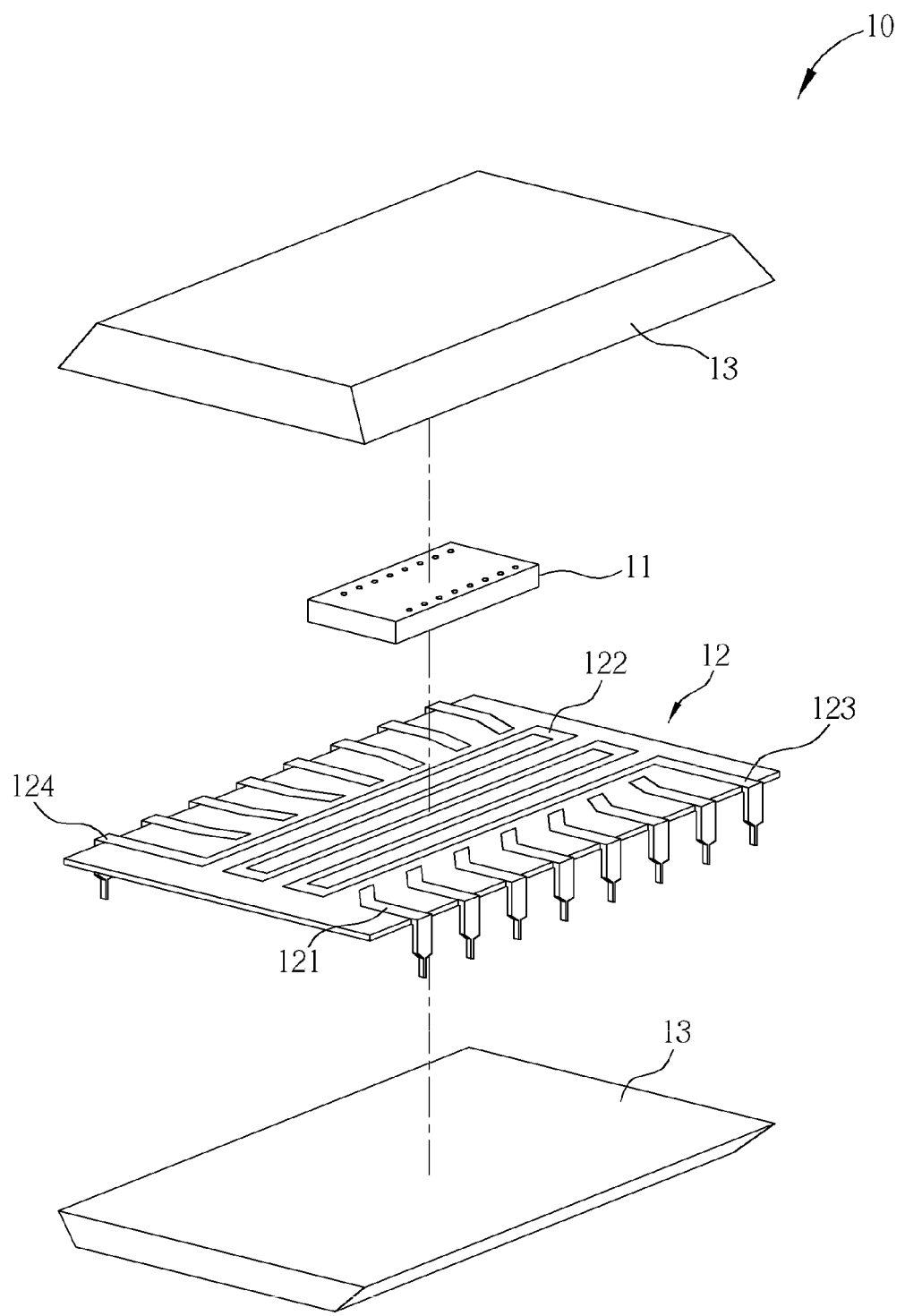
FIG. 1 is a schematic diagram showing an integrated circuit according to a preferred embodiment of the invention.
Figure 6:
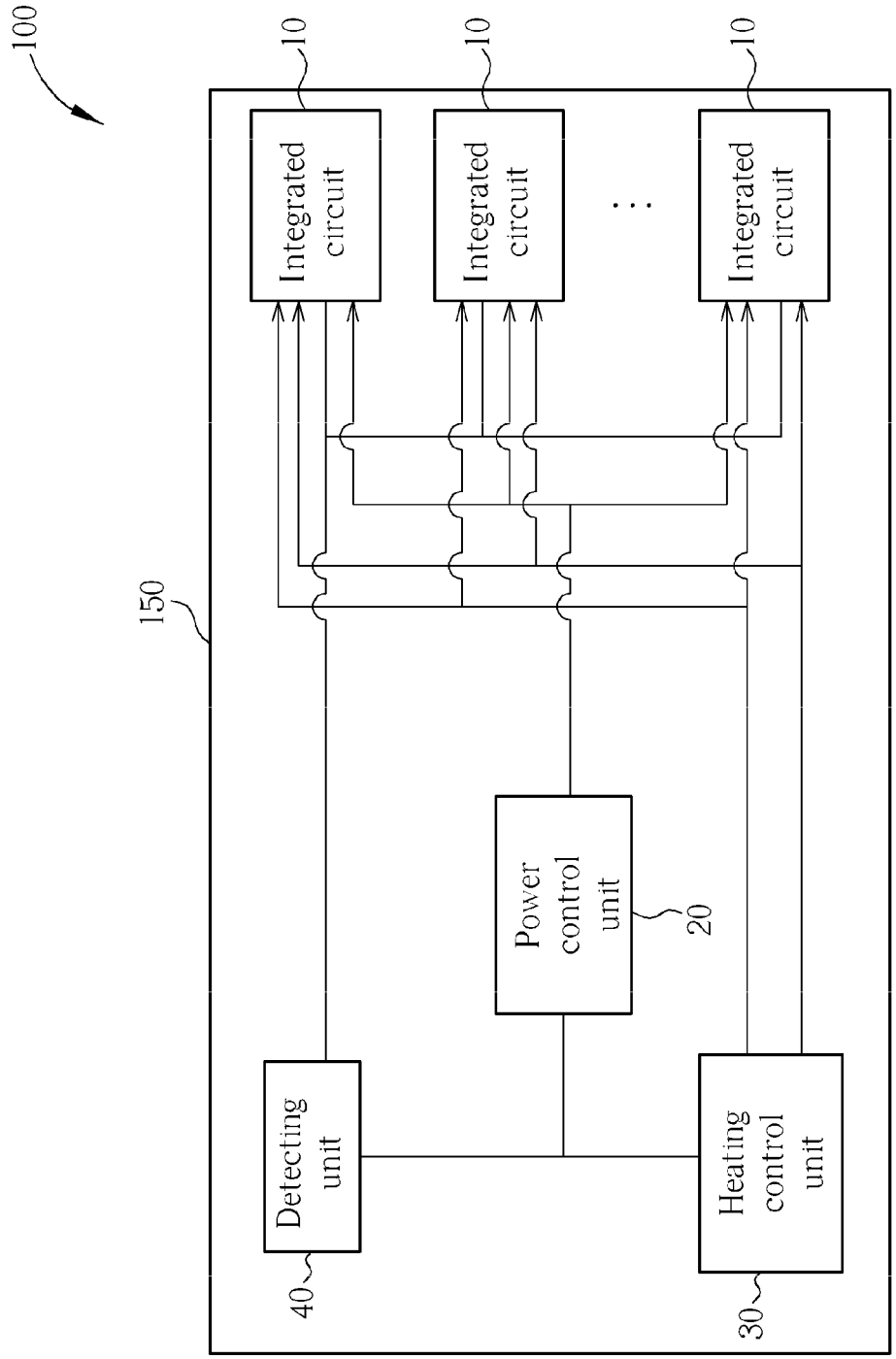
FIG. 6 is a block diagram of an electronic system according to a fifth embodiment of the invention.

Please refer to FIG. 1. FIG. 1 is a schematic diagram showing an integrated circuit 10 according to a preferred embodiment of the invention. The integrated circuit 10 incorporates a heating element inside, and can be heated under low temperature environment so as to function well. The low temperature said above is defined as the temperature lower than that of a normal operational environment for an electrical component. For example, the electrical components for commercial purpose generally come with specification of working temperature between 0~70° C., while those for industrial standard must satisfy the requirement for working between −40° C.~85° C. The integrated circuit 10 includes a chip die 11, a carrier 12, and a molding compound 13. In this embodiment, the carrier 12 is a lead frame including a plurality of signal pins 121 and a heating element 122, which is disposed to be combined with and to carry the chip die 11. To put it more specifically, the heating element 122 is utilized for increasing the temperature of the chip die 11 and hence, the chip die 11 is configured on the heating element 122 in order to be properly heated. The plurality of signal pins 121 connect to the chip die 11 via wirings (not showing in FIG. 1) and are used to insert or connect via the surface mount technology (SMT) to designated electrical nodes on a printed circuit board (such as the printed circuit board 150 as shown in FIG. 6) where the integrated circuit 10, such as a flash memory, is mounted. The heating element 122 may be a resistance wiring that has two connecting ends 123, 124. The heating element 122 is configured on the lead frame and is independently separated from the signal pins 121. Practically, the carrier 12 used for the integrated circuit 10 may be easily manufactured from a flat metal sheet, usually a copper sheet, to have a configured layout that includes both the heating element 122 and the plurality of signal pins 121. Therefore, the heating element 122 and the plurality of signal pins 121 could be preferably formed in single manufacturing process. The molding compound 13 is used to package both the chip die 11 and the carrier 12 to form the integrated circuit 10.

Figure 2:
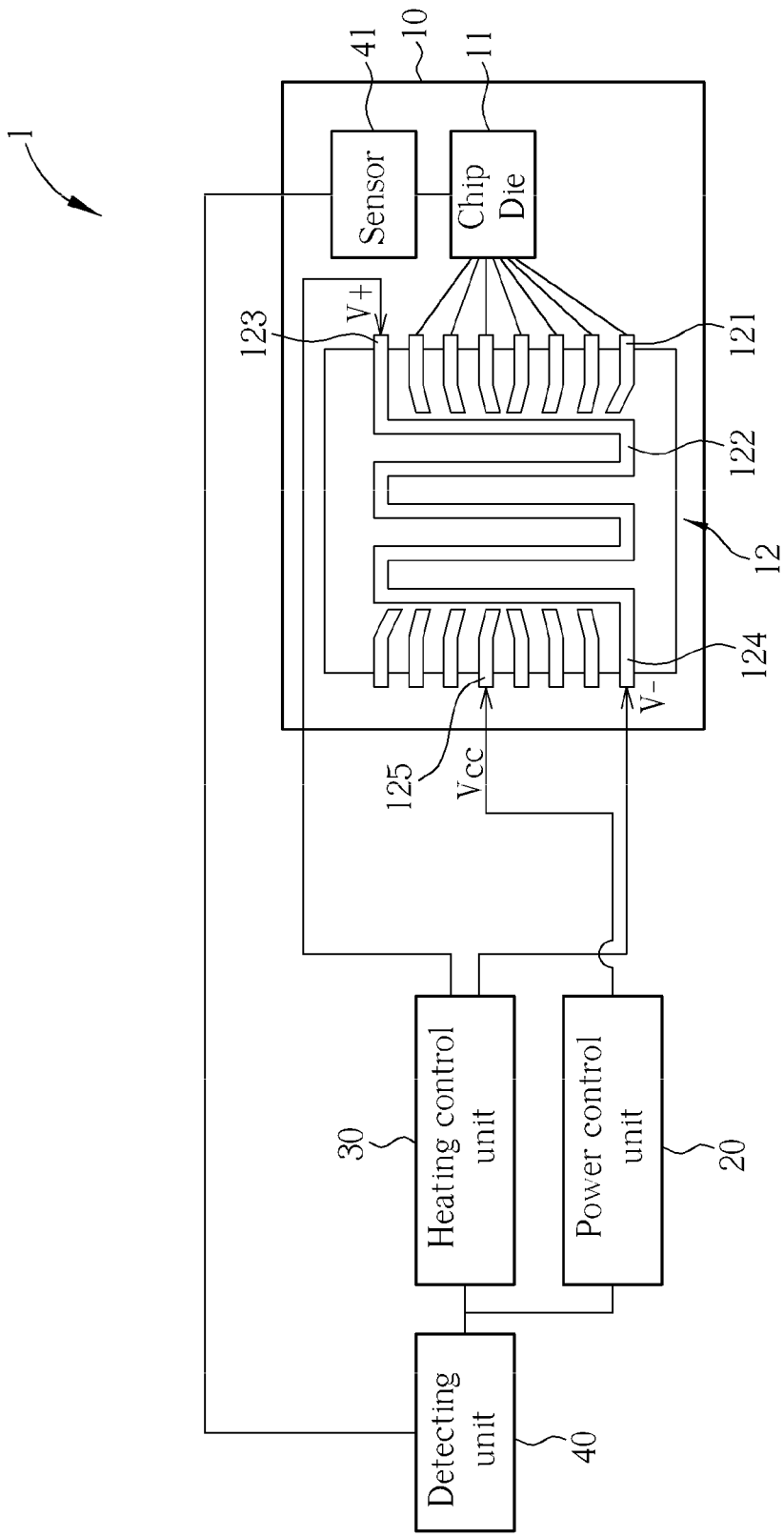
FIG. 2 is a block diagram of an electronic system according to a first embodiment of the invention.

FIG. 2 provides a preferred embodiment, which is a block diagram of an electronic system 1. Under the environment with low temperature which has been defined above, the electronic system 1 can increase the temperature of the integrated circuit 10 inside to be able to have normal functionality. The electronic system 1 includes at least an integrated circuit 10 that can be heated as previously described, a power control unit 20, a heating control unit 30, and a detecting unit 40. The power control unit 20 electrically connects to the integrated circuit 10 to provide an operation power for the integrated circuit 10. To be more specific, the power control unit 20 provides the operation power for the chip die 11 via at least one of the plurality of signal pins 121 (designated as power input pins 125) as shown in FIG. 2. The heating control unit 30 electrically connects to the two connecting ends 123, 124 of the heating element 122 and is utilized for selectively providing voltage, depending on the environmental condition of the chip die 11, so that the heating element 122 will selectively generate heat to increase the temperature of the chip die 11 since the heating element 122 is a resistance wiring.

As previously mentioned, for those components that may not be able to function well under low temperature as defined, the temperature of such components should be increased first to be able to have normal function. In other words, for integrated circuit 10 such as a flash memory, it may not be provided with power by the power control unit 20 before its temperature is increased to a predetermined condition, or above the predetermined condition. The predetermined condition may be the lowest temperature of a workable environmental condition of the electrical components. Hence, the detecting unit 40 provided by the electronic system 1 is utilized to detect the present condition of the integrated circuit 10. Preferably, the detecting unit 40 connects to a sensor 41 configured at the chip die 11 to obtain the temperature of the chip die 11 at the present condition. The sensor 41 may be additionally packaged in the molding compound 13 or an inherent one of the integrated circuit 10.

In order to correctly determine whether the chip die 11 should be heated, when the temperature of the chip die 11 detected by the detecting unit 40 falls below the predetermined temperature as previously mentioned, the heating control unit 30 provides voltage for the heating element 122 to increase the temperature of the chip die 11. When the temperature of the chip die 11 detected by the detecting unit 40 reaches or falls above the predetermined temperature as previously mentioned, the integrated circuit 10 turns out to be operational and then the operation power is provided by the power control unit 20 through the power input pins 125. It should be noted that, to ensure the integrated circuit 10 being always at its operational condition, the heating control unit 30 may further be utilized for controlling the heating element 122 to keep on heating the chip die 11, preferably with a lower voltage and providing less heat, to maintain the temperature of the chip die 11.

Figure 3:
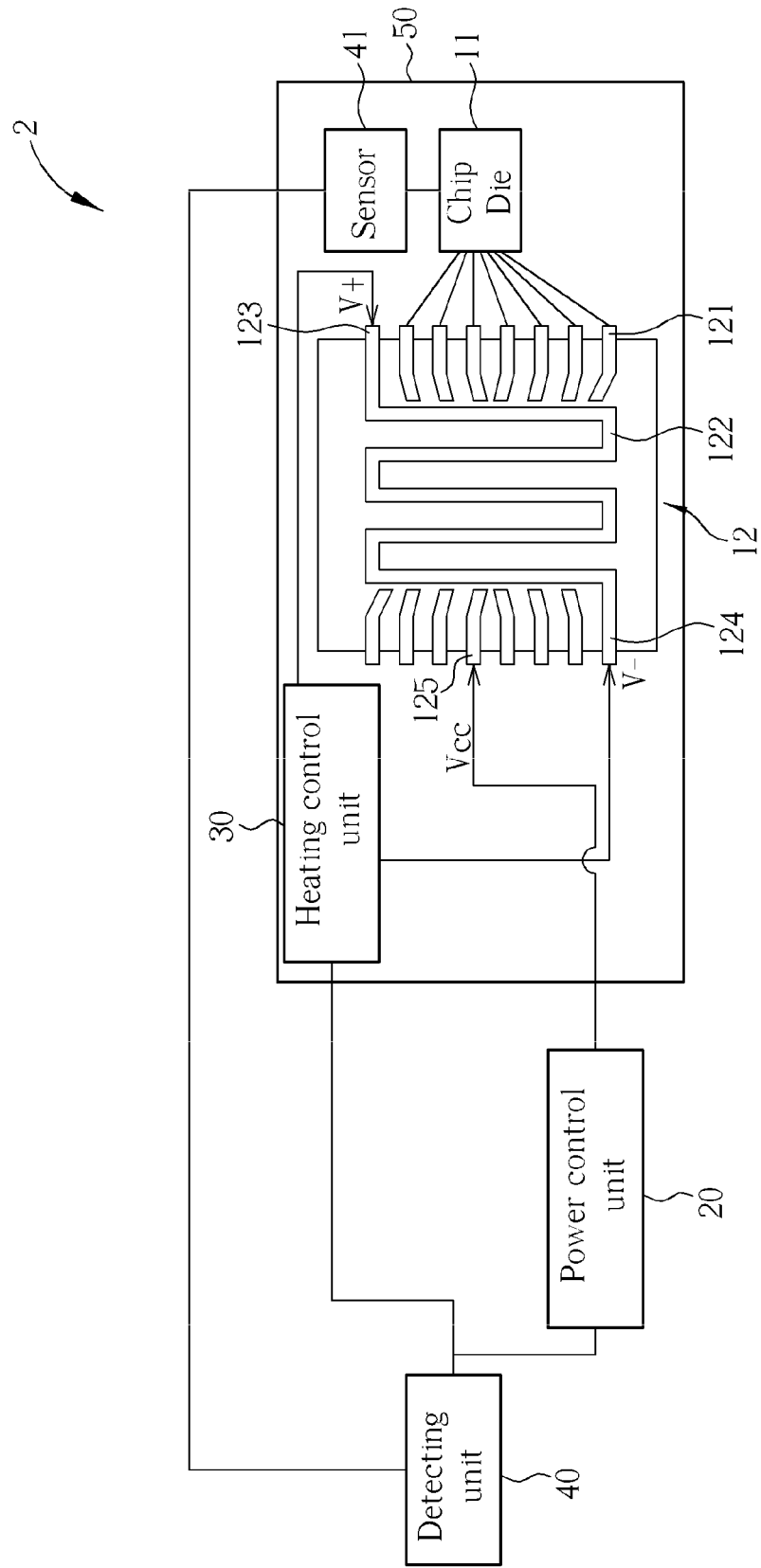
FIG. 3 is a block diagram of an electronic system according to a second embodiment of the invention.
Figure 4:
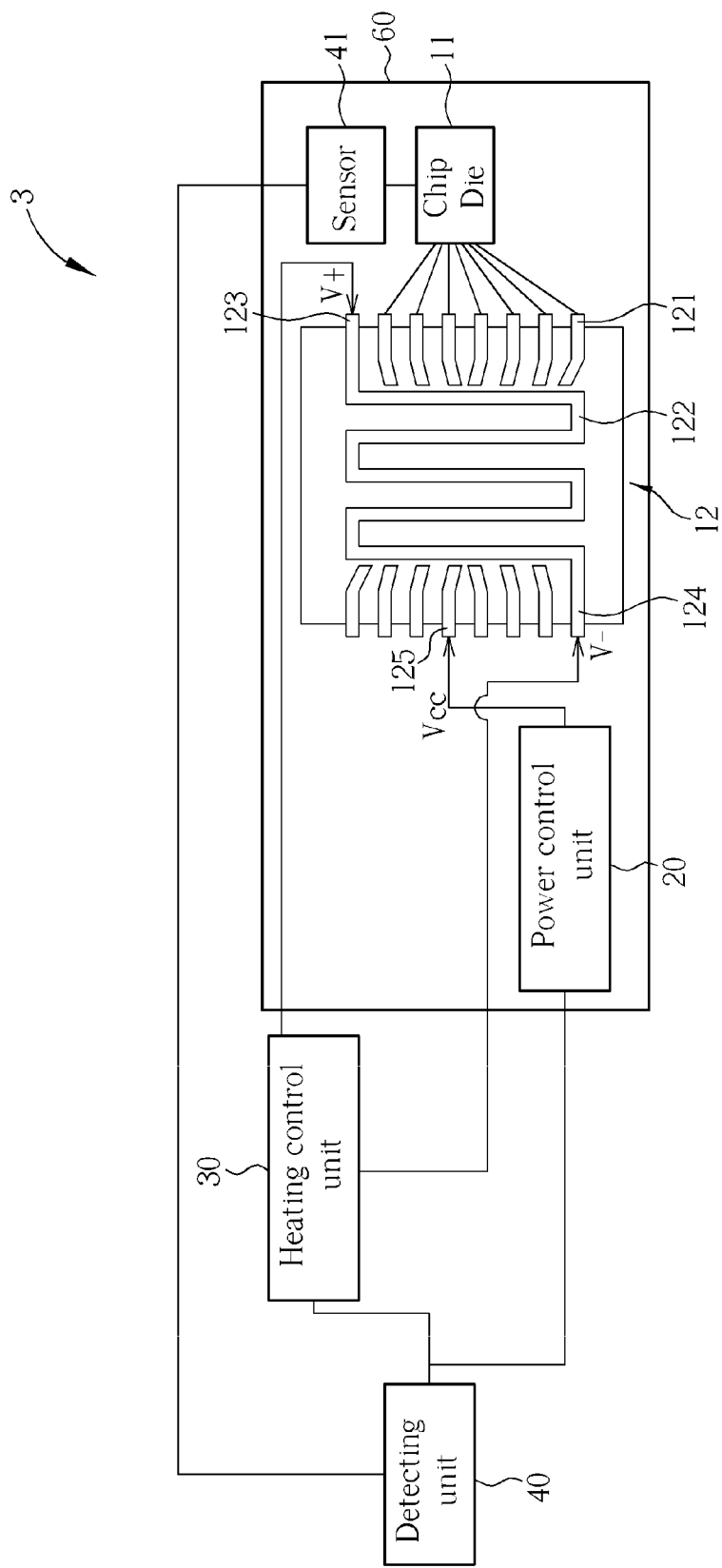
FIG. 4 is a block diagram of an electronic system according to a third embodiment of the invention.
Figure 5:
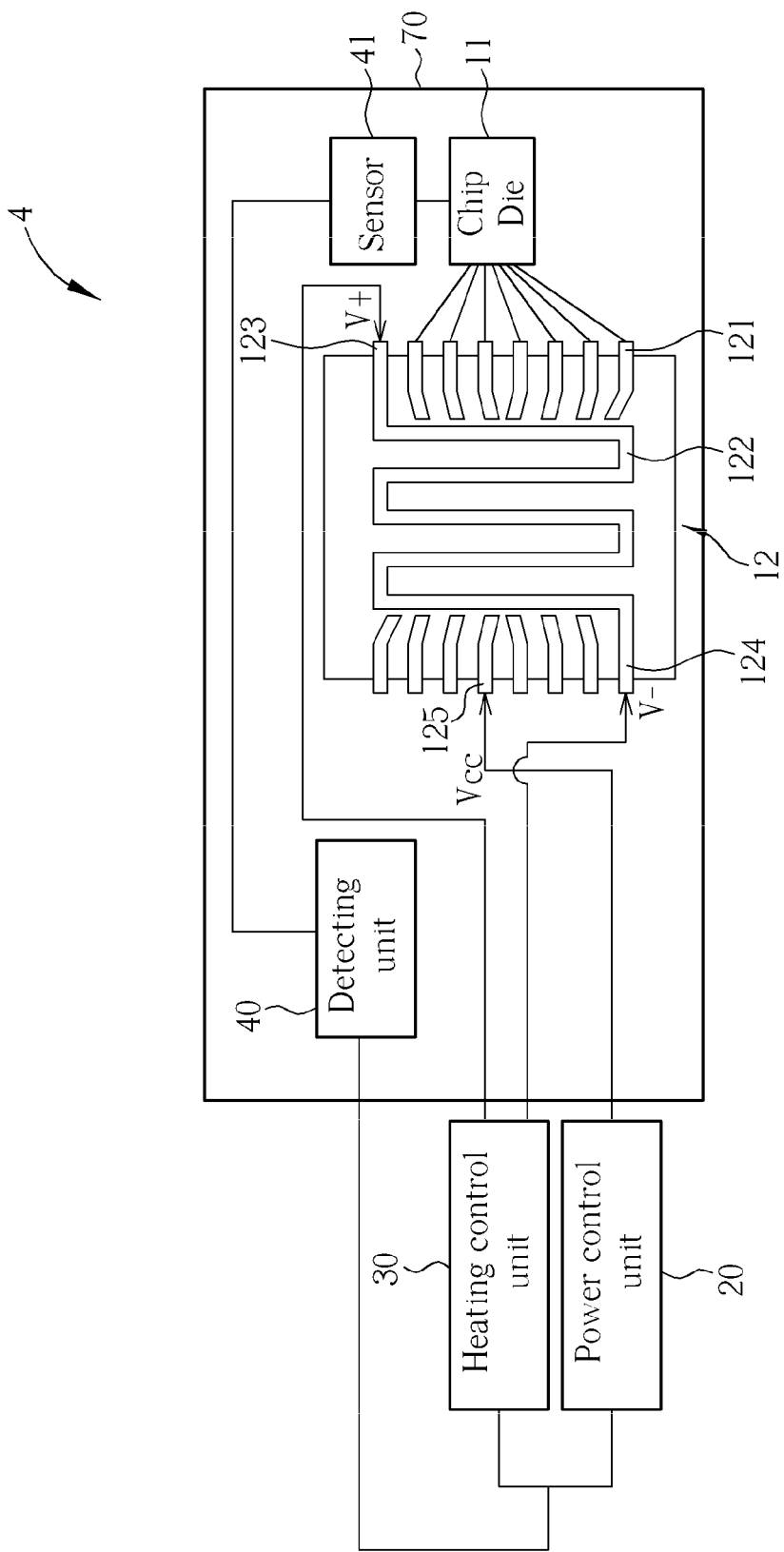
FIG. 5 is a block diagram of an electronic system according to a fourth embodiment of the invention.

In FIG. 2, the embodiment of the invention shows that the power control unit 20, the heating control unit 30, and the detecting unit 40 are separated from the integrated circuit 10 to control the heating process. There may be other alterations in other embodiments of the invention. For example, In a second embodiment in FIG. 3, the heating control unit 30 may be incorporated into the integrated circuit 50 to form a stand-along component, while the power control unit 20 and the detecting unit 40 are still separated from the integrated circuit 50 (on a printed circuit board of the electronic system 2). In a third embodiment of electronic system 3 in FIG. 4, the power control unit 20 may be incorporated into the integrated circuit 60, or simply using a built-in power control unit of the integrated circuit 60, to form a stand-along component, while the heating control unit 30 and the detecting unit 40 are still separated from the integrated circuit 60 (on a printed circuit board of the electronic system 3). In a fourth embodiment of electronic system 4 in FIG. 5, the detecting unit 40 may be incorporated into the integrated circuit 70, or simply using a built-in detecting unit of the integrated circuit 70, to form a stand-along component, while the heating control unit 30 and the power control unit 20 are still separated from the integrated circuit 70 (on a printed circuit board of the electronic system 4). Still in other embodiments of the invention, it may be any two of the power control unit 20, the heating control unit 30, and the detecting unit 40 that are incorporated into the integrated circuit to form a stand-along component. Still, all the three components, the power control unit 20, the heating control unit 30, and the detecting unit 40, may be incorporated into the integrated circuit to form a stand-along component in another embodiment.

Please refer to FIG. 6, which is a fifth embodiment of an electronic system 100 according to the invention. In the fifth embodiment, the electronic system 100 includes a plurality of integrated circuits 10 configured on a printed circuit board 150 under environment with temperature lower than an operation temperature for the integrated circuits 10. The power control unit 20, the heating control unit 30, and the detecting unit 40 connect and control each integrated circuit 10 as is described in the previous embodiments. With such configuration, the electronic system 100 may use one power control unit 20, one heating control unit 30, and one detecting unit 40 as a central control set to control any one of the integrated circuits 10 to function normally under a workable temperature.

Figure 7:
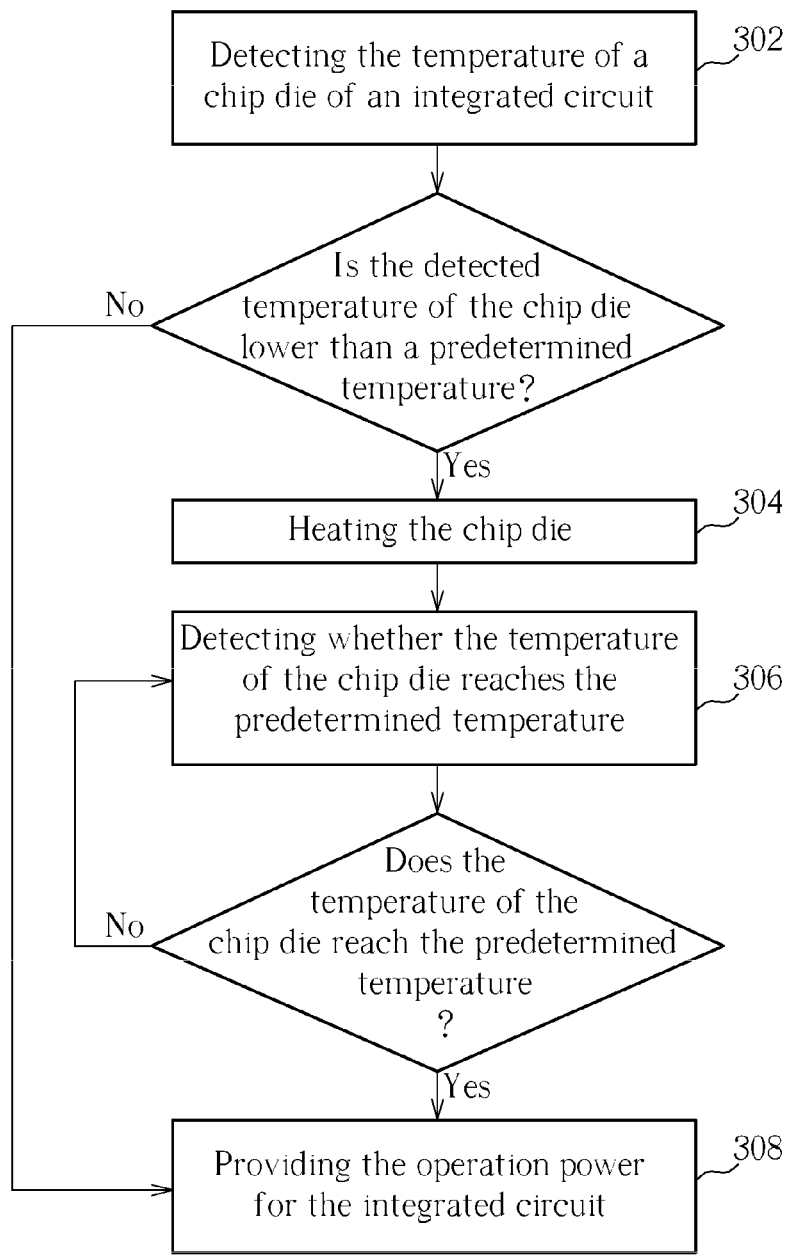
FIG. 7 is a schematic diagram of a flow chart of a method for increasing temperature of an integrated circuit according to an embodiment of the invention.

Please refer to FIG. 7, which is a schematic diagram of a flow chart of a method 300 for increase the temperature of an integrated circuit according to the preferred embodiment of the invention. The method at lease includes the following steps:

Step 302: detecting the temperature of a chip die of an integrated circuit, and checking whether the detected temperature of the chip die is lower than a predetermined temperature designated for the chip die; if the detected temperature is lower than the predetermined temperature, perform step 304; otherwise, perform step 308;

Step 304: heating the chip die;

Step 306: detecting whether the temperature of the chip die reaches the predetermined temperature; if the temperature of the chip die reaches the predetermined temperature, perform step 308; otherwise, perform step 304;

Step 308: providing the operation power for the integrated circuit.

In Step 302, the detecting unit 40 is used to detect the temperature of the chip die 11. The method 300 may further includes that the heating control unit 30 controls the heating element 122 to maintain the temperature of the chip die 11 when the temperature of the chip die 11 detected by the detecting unit 40 reaches or falls above the predetermined temperature. In Step 304, the heating control unit 30 is used to heat the chip die 11. In Step 308, the power control unit 20 is used to provide the operation power for the integrated circuit 10.

Figure 8:
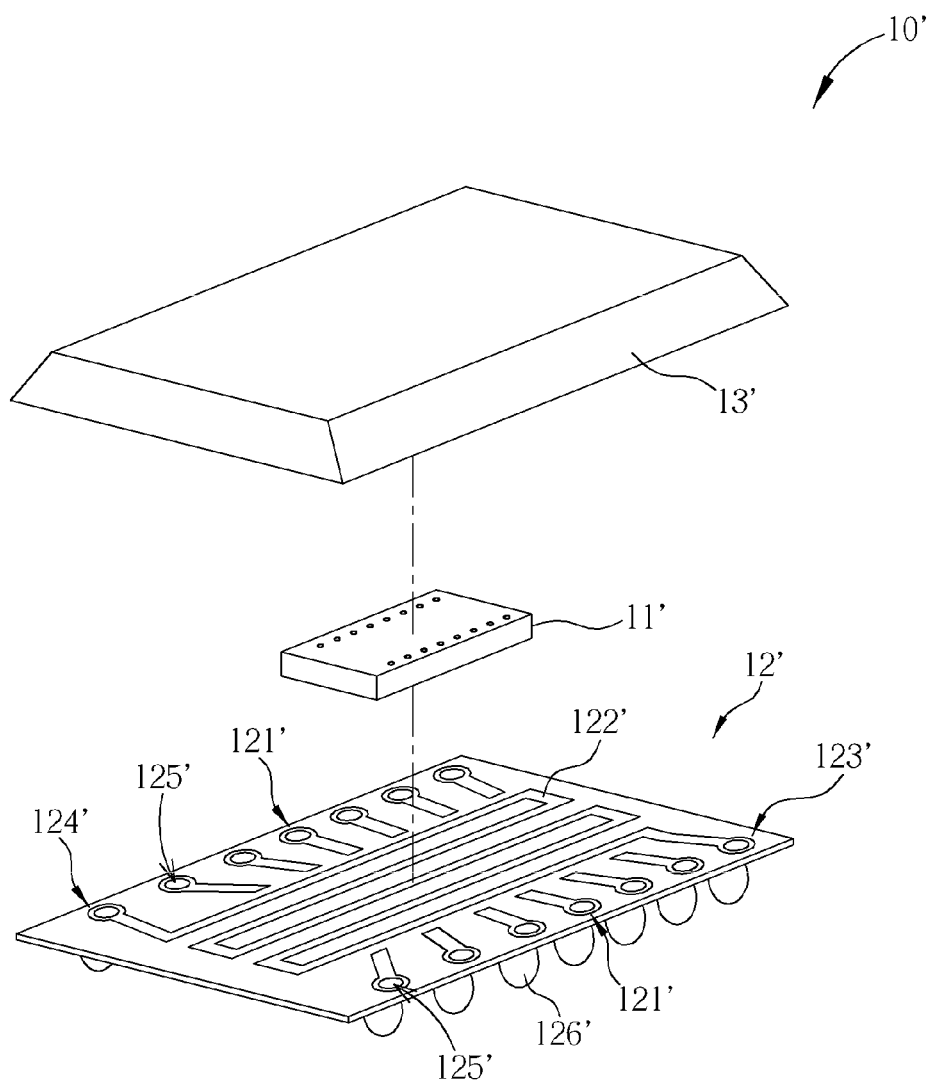
FIG. 8 is a schematic diagram showing an integrated circuit according to another embodiment of the invention.

Please refer to FIG. 8, which is a schematic diagram showing an integrated circuit 10' according to another embodiment of the invention. The integrated circuit 10' may be implemented as having a substrate as the carrier 12' for supporting a chip die 11', which is packaged with the substrate by the molding compound 13'. The carrier 12' includes a heating element 122' that has two connecting ends 123', 124' connected to the heating control unit as shown in the previous embodiment. The carrier 12' also includes a plurality of via holes 125' and signal pins 121' which connect to the chip die 11' via wirings (not showing in FIG. 8) and electrically connect to designated copper sheets or wirings on each layer of the substrate where the integrated circuit 10', such as a flash memory, is mounted, and connect to each solder ball or PCB pad 126' at the bottom of the substrate through the via holes 125'. Detailed feature of the integrated circuit 10' is similar as described in the previous embodiment, the integrated circuit 10 and is omitted here for brevity.

The embodiments described above show that to provide an integrated circuit, particularly a commercially designed flash memory, with functionality under environment with temperature lower than a working condition, the integrated circuit is designed to include a heating element incorporated with the signal pins on the carrier, such as a lead frame, that supports the chip die and controlled by a heating control unit to increase the temperature of the chip die. The heating control unit provides voltage for the heating element when the detecting unit detects that the temperature of the chip die falls below a predetermined temperature and the power control unit provide the operation power for the chip die when the temperature of the chip die detected by the detecting unit reaches or falls above the predetermined temperature. Only simple alteration of the lead frame and wiring between these existing components are needed to perform low temperature heating of an integrated circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for increasing temperature of an integrated circuit, which comprises a chip die, a carrier for supporting the chip die, and a molding compound for packaging the chip die and the carrier, the carrier comprising a heating element for increasing temperature of the chip die and a plurality of signal pins for connecting to the chip die, the method comprising:

detecting temperature of the chip die of the integrated circuit by using a detecting unit;

heating the chip die by using the heating element in the integrated circuit when temperature of the chip die is lower than a predetermined temperature, wherein the heating element is controlled by a heating control unit; and providing an operation power to the chip die when temperature of the chip die reaches or falls above the predetermined temperature, wherein the operation power is provided by a power control unit.

2. The method of claim 1, wherein the predetermined temperature is a lowest operational temperature of the integrated circuit.

3. The method of claim 1, wherein when temperature of the chip die detected by the detecting unit reaches or falls above the predetermined temperature, the heating control unit controls the heating element to maintain the temperature of the chip die.

* * * * *